United States Patent
Camacho et al.

(10) Patent No.: US 8,148,825 B2
(45) Date of Patent: Apr. 3, 2012

(54) INTEGRATED CIRCUIT PACKAGE SYSTEM WITH LEADFINGER

(75) Inventors: Zigmund Ramirez Camacho, Singapore (SG); Lionel Chien Hui Tay, Singapore (SG); Jairus Legaspi Pisigan, Singapore (SG); Jeffrey D. Punzalan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 781 days.

(21) Appl. No.: 12/134,179

(22) Filed: Jun. 5, 2008

(65) Prior Publication Data

US 2008/0303123 A1 Dec. 11, 2008

Related U.S. Application Data

(60) Provisional application No. 60/942,191, filed on Jun. 5, 2007.

(51) Int. Cl.
*H01L 23/48* (2006.01)
*H01L 23/52* (2006.01)
*H01L 29/40* (2006.01)
*H01L 21/00* (2006.01)

(52) U.S. Cl. ......... 257/777; 257/E25.006; 257/E25.018; 257/E25.021; 257/E25.027; 257/E25.03; 438/109; 438/123

(58) Field of Classification Search .................. 257/777; 438/109, 123
See application file for complete search history.

(56) References Cited

U.S. PATENT DOCUMENTS

| | | | | |
|---|---|---|---|---|
| 5,075,758 A | * | 12/1991 | Aizawa | 257/676 |
| 5,637,914 A | * | 6/1997 | Tanaka et al. | 257/666 |
| 5,767,566 A | | 6/1998 | Suda | |
| 5,812,381 A | * | 9/1998 | Shigeta et al. | 361/813 |
| 6,414,384 B1 | * | 7/2002 | Lo et al. | 257/685 |
| 6,545,365 B2 | * | 4/2003 | Kondo et al. | 257/777 |
| 6,555,902 B2 | * | 4/2003 | Lo et al. | 257/686 |
| 6,593,662 B1 | * | 7/2003 | Pu et al. | 257/777 |
| 6,650,009 B2 | * | 11/2003 | Her et al. | 257/686 |
| 6,710,455 B2 | * | 3/2004 | Goller et al. | 257/777 |
| 6,737,755 B1 | * | 5/2004 | McLellan et al. | 257/796 |
| 7,166,924 B2 | * | 1/2007 | Lu et al. | 257/777 |
| 7,193,298 B2 | | 3/2007 | Hong et al. | |
| 7,268,417 B2 | * | 9/2007 | Ochi et al. | 257/679 |
| 7,269,897 B2 | * | 9/2007 | Frezza | 29/832 |
| 7,323,786 B2 | * | 1/2008 | Sasaki | 257/777 |
| 7,863,723 B2 | * | 1/2011 | Oh et al. | 257/686 |
| 7,888,805 B2 | * | 2/2011 | Sasaki | 257/777 |
| 7,999,378 B2 | * | 8/2011 | Mess et al. | 257/723 |
| 8,049,342 B2 | * | 11/2011 | Mess et al. | 257/777 |
| 2003/0160308 A1 | * | 8/2003 | Ito | 257/666 |
| 2006/0125064 A1 | * | 6/2006 | Ito et al. | 257/666 |
| 2006/0157830 A1 | * | 7/2006 | Hoag | 257/668 |
| 2008/0036052 A1 | | 2/2008 | Do et al. | |
| 2008/0073758 A1 | * | 3/2008 | James | 257/666 |
| 2008/0105957 A1 | * | 5/2008 | Joshi et al. | 257/666 |

* cited by examiner

*Primary Examiner* — David Zarneke
(74) *Attorney, Agent, or Firm* — Mikio Ishimaru

(57) ABSTRACT

An integrated circuit package system includes: providing a lead terminal; forming a dummy lead near the lead terminal; positioning a base integrated circuit adjacent the lead terminal and the dummy lead; connecting a die connector to the base integrated circuit and the dummy lead; mounting a stackable integrated circuit over the base integrated circuit; and connecting another of the die connector to the stackable integrated circuit and the dummy lead.

20 Claims, 7 Drawing Sheets

INTEGRATED CIRCUIT PACKAGE SYSTEM WITH LEADFINGER

CROSS-REFERENCE TO RELATED APPLICATION(S)

This application claims the benefit of U.S. Provisional Patent Application Ser. No. 60/942,191 filed Jun. 5, 2007, and the subject matter thereof is hereby incorporated herein by reference thereto.

TECHNICAL FIELD

The present invention relates generally to integrated circuit package systems and more particularly to a system for integrated circuit packages with package in package.

BACKGROUND ART

Demands for smaller, higher performance semiconductor devices have motivated the development of new techniques for producing smaller and less expensive semiconductor devices. One of these technologies involves packaging the integrated circuit chip in as small a form factor as possible and manufacturing the integrated circuit chip as efficiently as possible.

Electronics have become very commonplace, including personal portable devices such as cellular phones, digital cameras, and music players as well as control or memory systems. These electronic products require increasing integrated circuit chip content to fit an ever-shrinking physical space as well as increasing performance.

Many individual devices are typically constructed on the same wafer. When the devices are separated into individual rectangular units, each takes the form of an integrated circuit chip. In order to interface a chip with other circuitry, it is common to mount it with lead terminals and individually connect pad on the chip to the lead terminals using extremely fine wires. The assemblies are then packaged by individually encapsulating them in molded plastic or ceramic bodies.

Integrated circuit packaging technology has demonstrated an increase in the number of chips mounted on a single circuit board or substrate paralleling the reduction in the number of components needed for a product. The resulting packaging designs are more compact in the physical size, shape, and significantly increase overall circuit density. However, circuit density continues to be limited by the area available for mounting chips.

To condense the packaging of individual devices, packages have been developed in which more than one device can be packaged at one time for each package site. Each package site is a structure that provides mechanical support for the individual integrated circuit devices. It also provides one or more layers of interconnect lines that enable the devices to be connected electrically to surrounding circuitry.

In some cases, multi-chip devices can be fabricated faster and more cheaply than a corresponding single integrated circuit chip, that incorporates all the same functions. Some multi-chip modules have been found to increase circuit density and miniaturization, improve signal propagation speed, reduce overall device size, improve performance, and lower costs.

However, such multi-chip modules can be bulky. Package density is determined by the area required to mount a chip or module. One method for reducing the size of multi-chip modules and thereby increasing their effective density is to stack the chips vertically within the module or package. Such designs are improvements over prior packages that combined several chips and associated passive components side by side in a single, horizontal layer.

Multi-chip modules can also present problems with die-to-die bonding of two similar-sized stacked dies. In most stacked die applications, multiple die-to-die bonding is required. Attempts include using vacant or "no connect" leads but this becomes impossible when numerous die-to-die connecting pairs exist and when leads are occupied.

Despite the advantages of recent developments in semiconductor fabrication and packaging techniques, there is a continuing need for improving packaging methods, systems, and designs.

Thus, a need still remains for an integrated circuit package system to provide a lower profile, increase the number of devices in a package system, and provide die-to-die bonding when the stacked dies are of the same or similar size.

In view of the ever-increasing commercial competitive pressures, along with growing consumer expectations and the diminishing opportunities for meaningful product differentiation in the marketplace, it is critical that answers be found for these problems.

Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention includes: providing a lead terminal; forming a dummy lead near the lead terminal; positioning a base integrated circuit adjacent the lead terminal and the dummy lead; connecting a die connector to the base integrated circuit and the dummy lead; mounting a stackable integrated circuit over the base integrated circuit; and connecting another of the die connector to the stackable integrated circuit and the dummy lead.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
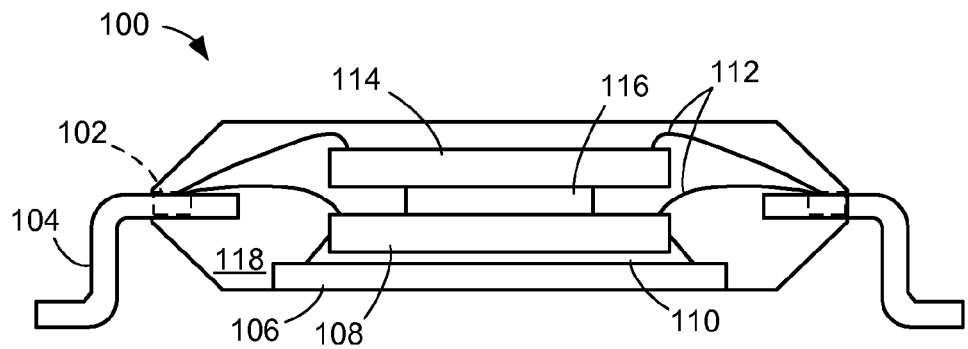
FIG. 1 is a cross-sectional view of an integrated circuit package system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "upward", "downward", "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 2:
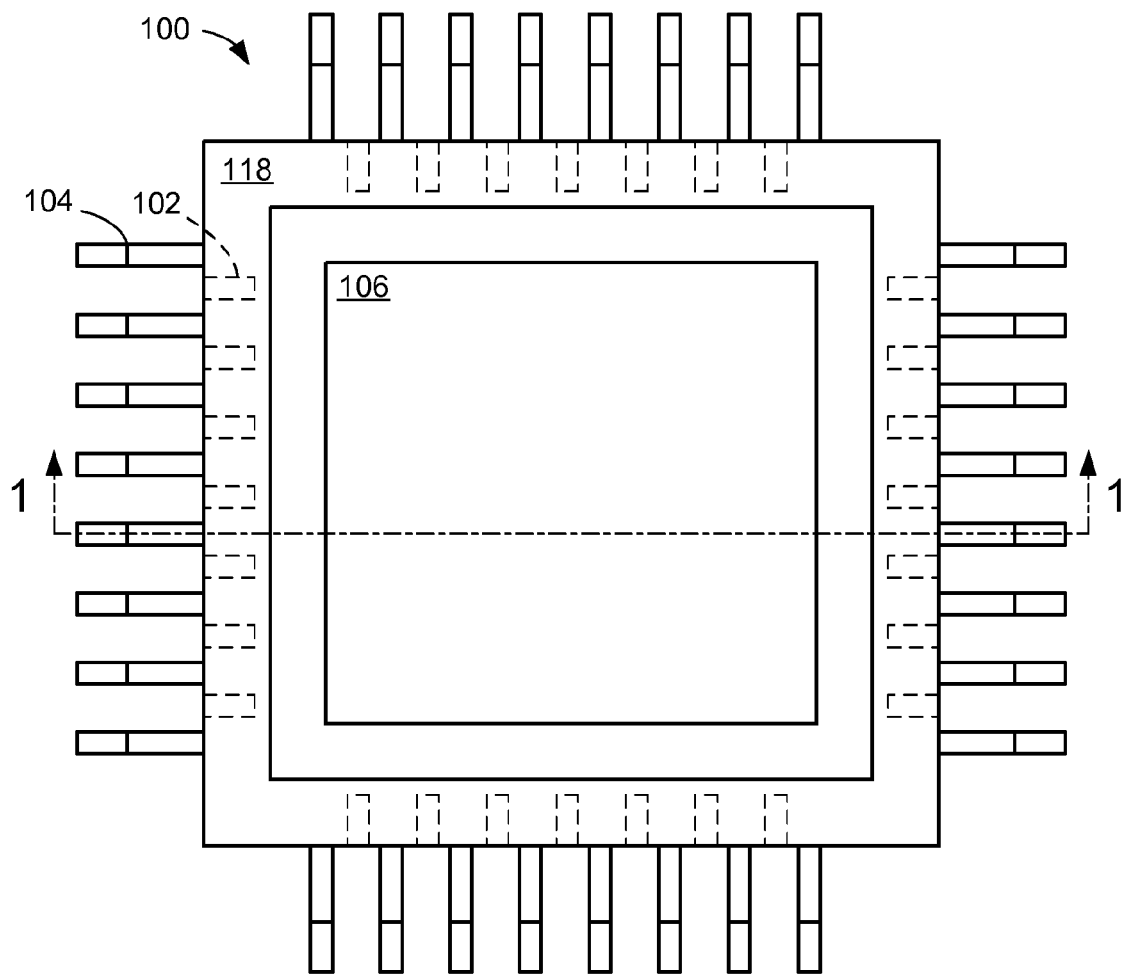
FIG. 2 is a bottom plan view of the integrated circuit package system.

Referring now to FIG. 1, therein is shown a cross-sectional view of an integrated circuit package system 100 taken along line 1-1 of FIG. 2 in a first embodiment of the present invention. The integrated circuit package system 100 preferably includes dummy leads 102, lead terminals 104 such as lead fingers, and a die attach pad 106.

A base integrated circuit 108 can be mounted over the die attach pad 106 with a mount material 110 and electrically connected to the dummy leads 102 or the lead terminals 104 with die connectors 112 such as bond wires. Similarly, a stackable integrated circuit 114 can be attached or mounted over the base integrated circuit 108 with a spacer material 116 such as an adhesive spacer and electrically connected with the die connectors 112.

The spacer material 116 can provide adhesion to the base integrated circuit 108 and the stackable integrated circuit 114.

Further, the spacer material 116 can provide spacing between the base integrated circuit 108 and the stackable integrated circuit 114 predetermined for eliminating damage or shorting to the die connectors 112.

The dummy leads 102 provide electrical connectivity for the base integrated circuit 108 and the stackable integrated circuit 114. For example, one of the die connectors 112 connecting a portion of the base integrated circuit 108 and another one of the die connectors 112 connecting a portion of the stackable integrated circuit 114 can be connected to one of the dummy leads.

The dummy leads 102 can provide electrical connectivity between multiple integrated circuit die thereby eliminating the need for one or more unconnected or vacant of the lead terminals 104. The lead terminals 104 preferably provide connectivity for electrical signals or levels to integrated circuit die particularly with external connections and are typically unavailable for internal connections.

An encapsulant 118 can be applied over the die connectors 112, the base integrated circuit 108, the stackable integrated circuit 114, portions of the lead terminals 104, and portions of the die attach pad 106. The encapsulant 118 can cover and protect circuitry and components to form a package such as a quad flat package (QFP) having the lead terminals 104 on four sides.

It has been unexpectedly discovered that the integrated circuit package system 100 with the dummy leads 102 enables die-to-die connectivity without the need for staggering, different sized die, or vacant leads. The dummy leads 102 can electrically connect the base integrated circuit 108 and the stackable integrated circuit 114 without utilizing the lead terminals 104 needed for inputs or outputs and thereby scarce.

For example, the dummy lead can be formed as a jumper node for electrical connection of the stackable integrated circuit and the base integrated circuit without the need for the lead terminal and with the stackable integrated circuit substantially the same size as the base integrated circuit.

Referring now to FIG. 2, therein is shown a bottom plan view of the integrated circuit package system 100. The integrated circuit package system 100 preferably includes the dummy leads 102 adjacent the lead terminals 104, the die attach pad 106, and the encapsulant 118. The dummy leads 102 are preferably isolated from external connectivity and are shown with hidden lines as the dummy leads 102 can be covered by the encapsulant 118.

The die attach pad 106 can optionally be exposed adjacent the encapsulant 118. For example, a bottom surface of the encapsulant 118 can provide a bottom surface of the die attach pad 106 substantially exposed thereby providing a connection or conduction surface. The die attach pad 106 can be connected to an electrical level or provide thermal dissipation for the internal components such as the base integrated circuit 108 or the stackable integrated circuit 114.

Figure 3:
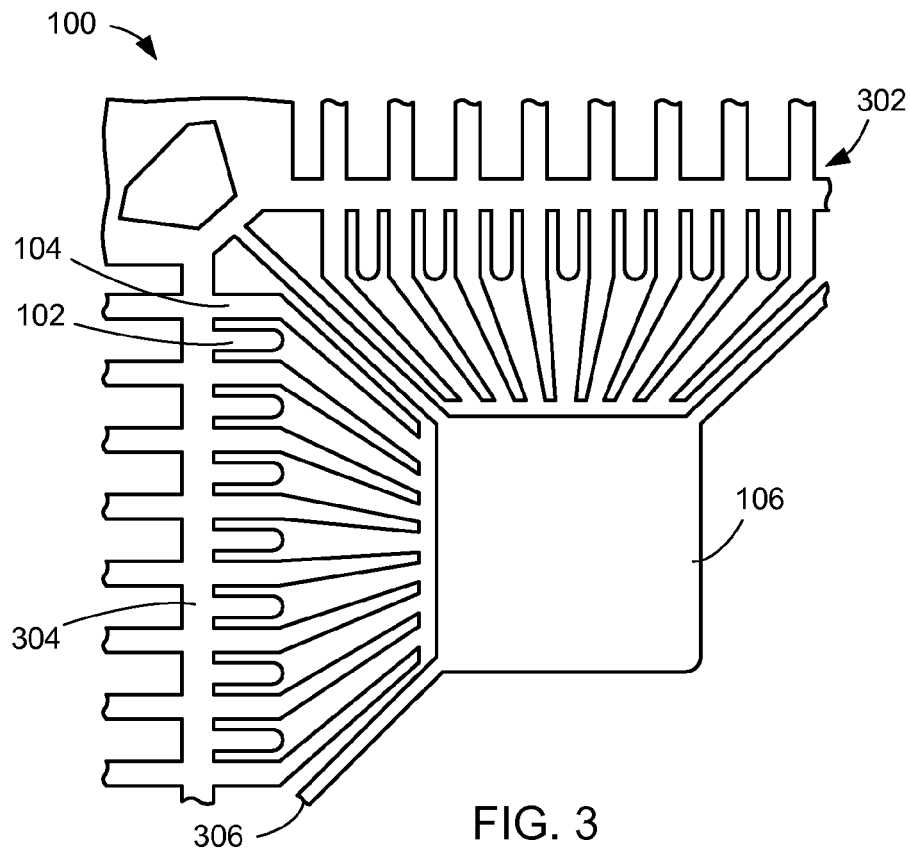
FIG. 3 is a partial top plan view of the integrated circuit package system in a leadframe phase.

Referring now to FIG. 3, therein is shown a partial top plan view of the integrated circuit package system 100 in a leadframe phase. Details of a portion of the integrated circuit package system 100 are shown for clarity. The integrated circuit package system 100 preferably includes a leadframe 302 having the dummy leads 102, the lead terminals 104, and the die attach pad 106.

The leadframe 302 provides structural integrity to the dummy leads 102, the lead terminals 104, and the die attach pad 106 during processing. Processes such as encapsulation can also provide structural integrity to the dummy leads 102, the lead terminals 104, and the die attach pad 106 and allow portions of the leadframe 302 to be removed.

A dambar 304 and a tiebar 306 can provide structural integrity and substantially fixed positions for the dummy leads 102, the lead terminals 104, or the die attach pad 106 during processing. The dambar 304 and the tiebar 306 can preferably be removed during processing to provide singulation or electrical isolation of the each of the dummy leads 102 or the lead terminals 104.

Figure 4:
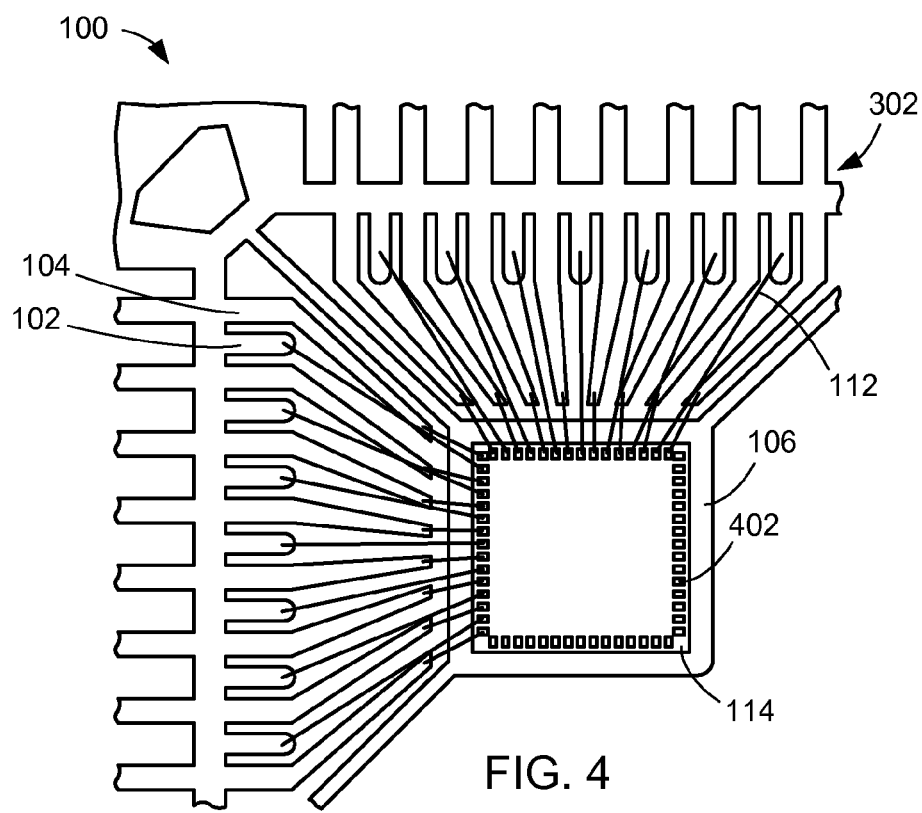
FIG. 4 is the structure of FIG. 3 in an attachment phase.

Referring now to FIG. 4, therein is shown the structure of FIG. 3 in an attachment phase. The integrated circuit package system 100 preferably includes the stackable integrated circuit 114 mounted over the base integrated circuit 108 of FIG. 1 and the die attach pad 106 of the leadframe 302. The stackable integrated circuit 114 and the base integrated circuit 108 can be connected to the dummy leads 102 or the lead terminals 104 with the die connectors 112.

The stackable integrated circuit 114 can include connection sites 402 such as die pads for the die connectors 112. The connection sites 402 can provide electrical connectivity to internal circuitry of the stackable integrated circuit 114 for the die connectors 112 and thereby other components or a next level system. The base integrated circuit 108 can also include the connection sites 402 or similar elements.

Figure 5:
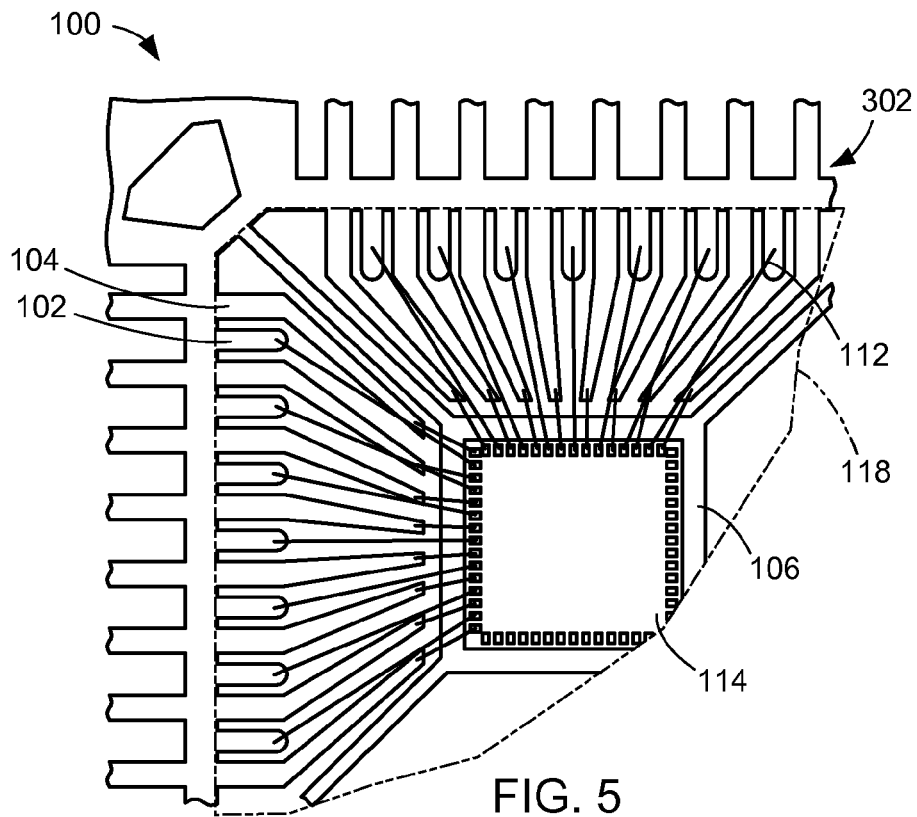
FIG. 5 is the structure of FIG. 4 in a mold phase.

Referring now to FIG. 5, therein is shown the structure of FIG. 4 in a mold phase. The integrated circuit package system 100 preferably includes the encapsulant 118, the leadframe 302, and the stackable integrated circuit 114 over the base integrated circuit 108 of FIG. 1 and the leadframe 302. The die connectors 112 can connect the stackable integrated circuit 114 or the base integrated circuit 108.

The encapsulant 118 is shown with phantom lines for clarity. The stackable integrated circuit 114, the base integrated circuit 108, the die connectors 112, and portions of the leadframe 302 can be covered and protected by the encapsulant 118. The encapsulant 118 can also provide structural integrity to the dummy leads 102, the lead terminals 104, or the die attach pad 106.

Figure 6:
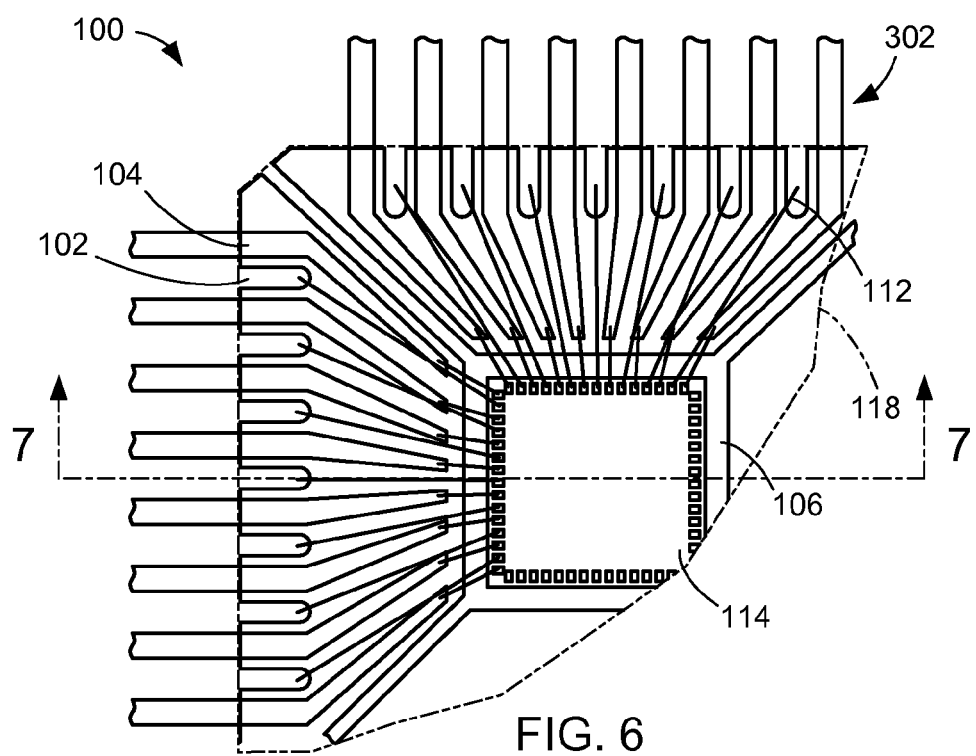
FIG. 6 is the structure of FIG. 5 in a singulation phase.

Referring now to FIG. 6, therein is shown the structure of FIG. 5 in a singulation phase. The integrated circuit package system 100 preferably includes the encapsulant 118, the dummy leads 102, the lead terminals 104, the die attach pad 106. The dambar 304 of FIG. 3 has been removed with a removal apparatus such a toothed punch tool for isolation.

The dummy leads 102, the lead terminals 104, and the die attach pad 106 are electrically isolated to provide discrete connectivity for electrical signals or levels. Each of the dummy leads 102 or the lead terminals 104 can be connected to electrical signals or levels appropriate to the components or applications.

Figure 7:
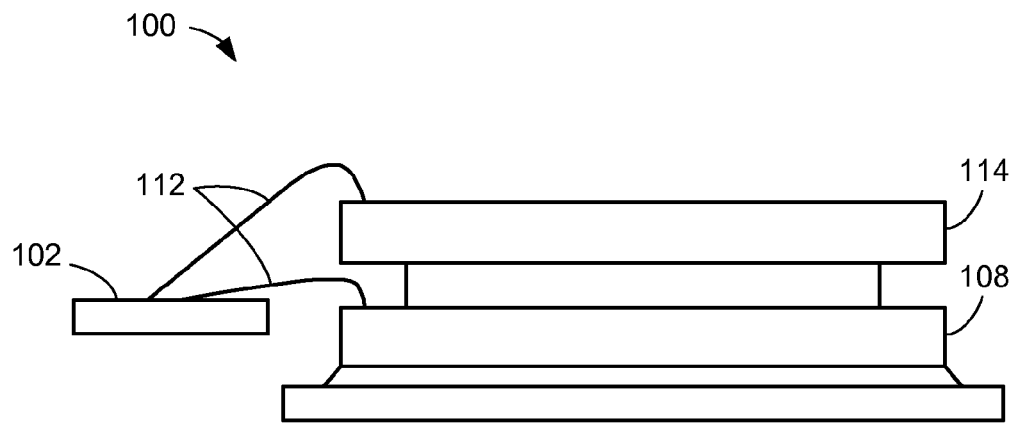
FIG. 7 is a cross-sectional view of the integrated circuit package system taken along line 7-7 of FIG. 6.

Referring now to FIG. 7, therein is shown a cross-sectional view of the integrated circuit package system 100 taken along line 7-7 of FIG. 6. Details of a portion of the integrated circuit package system 100 are shown and the encapsulant 118 has been removed for clarity. The integrated circuit package system 100 preferably includes the base integrated circuit 108 and the stackable integrated circuit 114 connected to one of the dummy leads 102.

One of the dummy leads 102 can be electrically connected to the base integrated circuit 108 and the stackable integrated circuit 114. One of the die connectors 112 can connect the base integrated circuit 108 and another of the die connectors 112 can connect the stackable integrated circuit 114 thereby providing die-to-die connectivity without the need for unconnected or vacant instances of the lead terminals 104.

Figure 8:
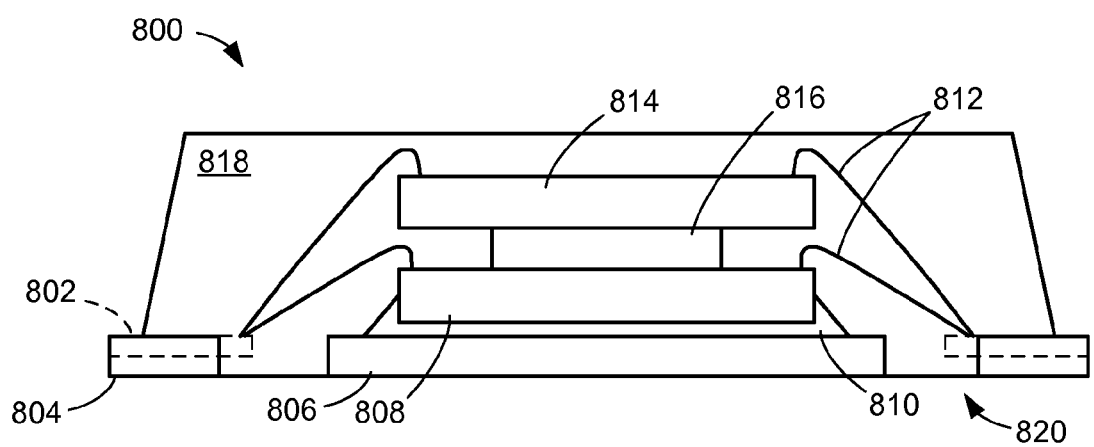
FIG. 8 is a cross-sectional view of an integrated circuit package system taken along line 8-8 of FIG. 9 in a second embodiment of the present invention.
Figure 9:
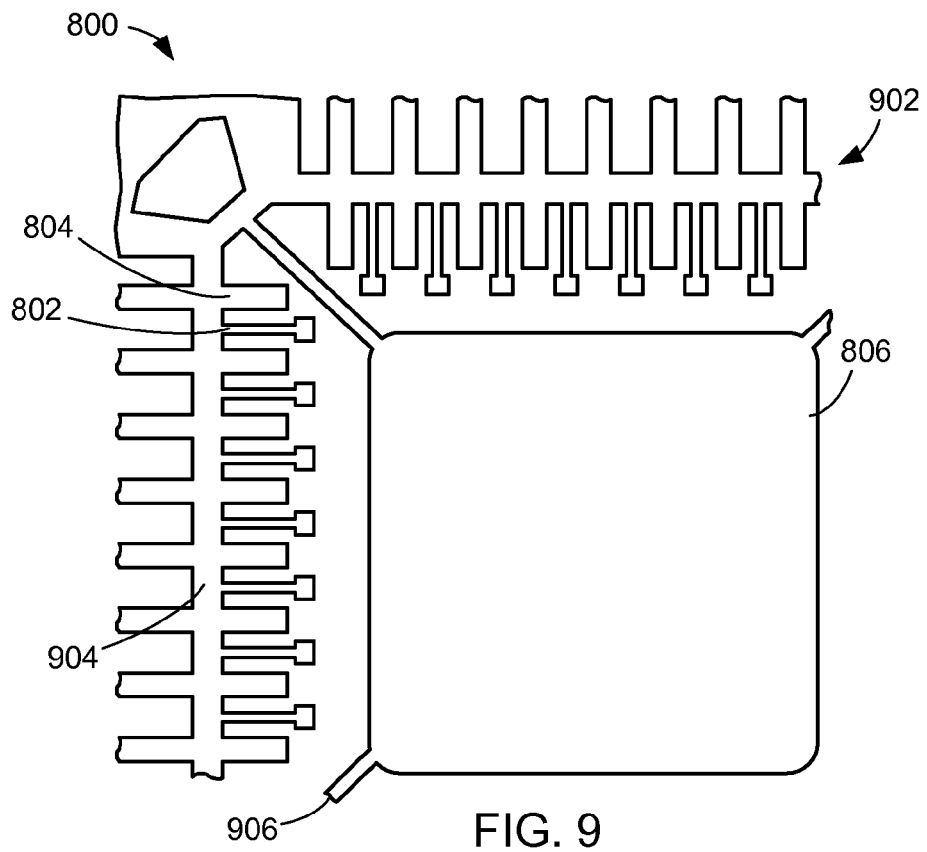
FIG. 9 is a partial top plan view of the integrated circuit package system in a leadframe phase.

Referring now to FIG. 8, therein is shown a cross-sectional view of an integrated circuit package system 800 taken along line 8-8 of FIG. 9 in a second embodiment of the present invention. The integrated circuit package system 800 preferably includes dummy leads 802, lead terminals 804 such as nolead terminals, and a die attach pad 806.

A base integrated circuit 808 can be mounted over the die attach pad 806 with a mount material 810 and electrically connected to the dummy leads 802 or the lead terminals 804 with die connectors 812 such as bond wires. Similarly, a stackable integrated circuit 814 can be attached or mounted over the base integrated circuit 808 with a spacer material 816 such as an adhesive spacer and electrically connected with the die connectors 812.

The spacer material 816 can provide adhesion to the base integrated circuit 808 and the stackable integrated circuit 814. Further, the spacer material 816 can provide spacing between the base integrated circuit 808 and the stackable integrated circuit 814 predetermined for eliminating damage or shorting to the die connectors 812.

The dummy leads 802 provide electrical connectivity for the base integrated circuit 808 and the stackable integrated circuit 814. For example, one of the die connectors 812 connecting a portion of the base integrated circuit 808 and another of the die connectors 812 connecting a portion of the stackable integrated circuit 814 can be connected to one of the dummy leads.

The dummy leads 802 can preferably be half-etched to provide a thickness of the dummy leads 802 less than a thickness of the lead terminals 804 thereby eliminating exposure from a package backside. The lead terminals 804 can be electrically connected from a package backside without exposure of the dummy leads 802 adjacent the lead terminals.

The dummy leads 802 can provide electrical connectivity between multiple integrated circuit die thereby eliminating the need for one or more unconnected or vacant of the lead terminals 804. The lead terminals 804 preferably provide connectivity for electrical signals or levels to integrated circuit die particularly with external connections and are typically unavailable for internal connections.

An encapsulant 818 can be applied over the die connectors 812, the base integrated circuit 808, the stackable integrated circuit 814, portions of the lead terminals 804, and portions of the die attach pad 806. The encapsulant 818 can cover and protect circuitry and components to form a package such as a quad flat nolead (QFN) having the lead terminals 804 partially exposed adjacent a package backside surface 820.

Referring now to FIG. 9, therein is a partial top plan view of the integrated circuit package system 800 in a leadframe phase. Details of a portion of the integrated circuit package system 800 are shown for clarity. The integrated circuit package system 800 preferably includes a leadframe 902 having the dummy leads 802, the lead terminals 804, and the die attach pad 806.

The leadframe 902 provides structural integrity to the dummy leads 802, the lead terminals 804, and the die attach pad 806 during processing. Processes such as encapsulation can also provide structural integrity to the dummy leads 802, the lead terminals 804, and the die attach pad 806 and allow portions of the leadframe 902 to be removed.

A dambar 904 and a tiebar 906 can provide structural integrity and substantially fixed positions for the dummy leads 802, the lead terminals 804, or the die attach pad 806 during processing. The dambar 904 and the tiebar 906 can preferably be removed during processing to provide singulation or electrical isolation of the each of the dummy leads 802 or the lead terminals 804.

Figure 10:
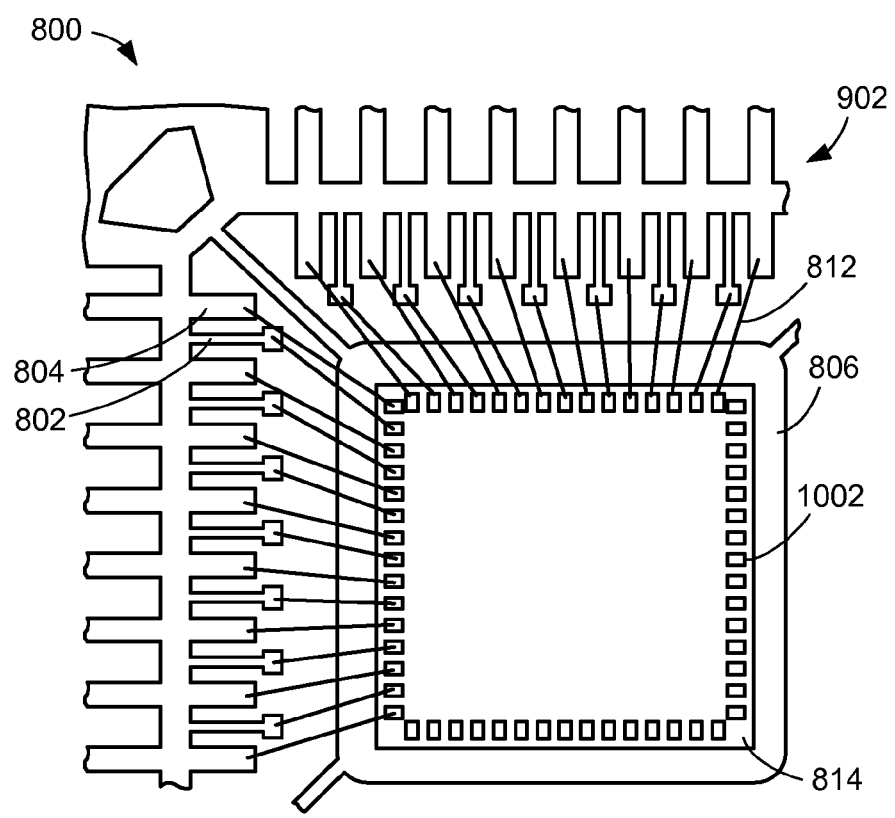
FIG. 10 is the structure of FIG. 9 in an attachment phase.

Referring now to FIG. 10, therein is shown the structure of FIG. 9 in an attachment phase. The integrated circuit package system 800 preferably includes the stackable integrated circuit 814 mounted over the base integrated circuit 808 of FIG.

8 and the die attach pad 806 of the leadframe 902. The stackable integrated circuit 814 and the base integrated circuit 808 can be connected to the dummy leads 802 or the lead terminals 804 with the die connectors 812.

The stackable integrated circuit 814 can include connection sites 1002 such as die pads for the die connectors 812. The connection sites 1002 can provide electrical connectivity to internal circuitry of the stackable integrated circuit 814 for the die connectors 812 and thereby other components or a next level system. The base integrated circuit 808 can also include the connection sites 1002 or similar elements.

Figure 11:
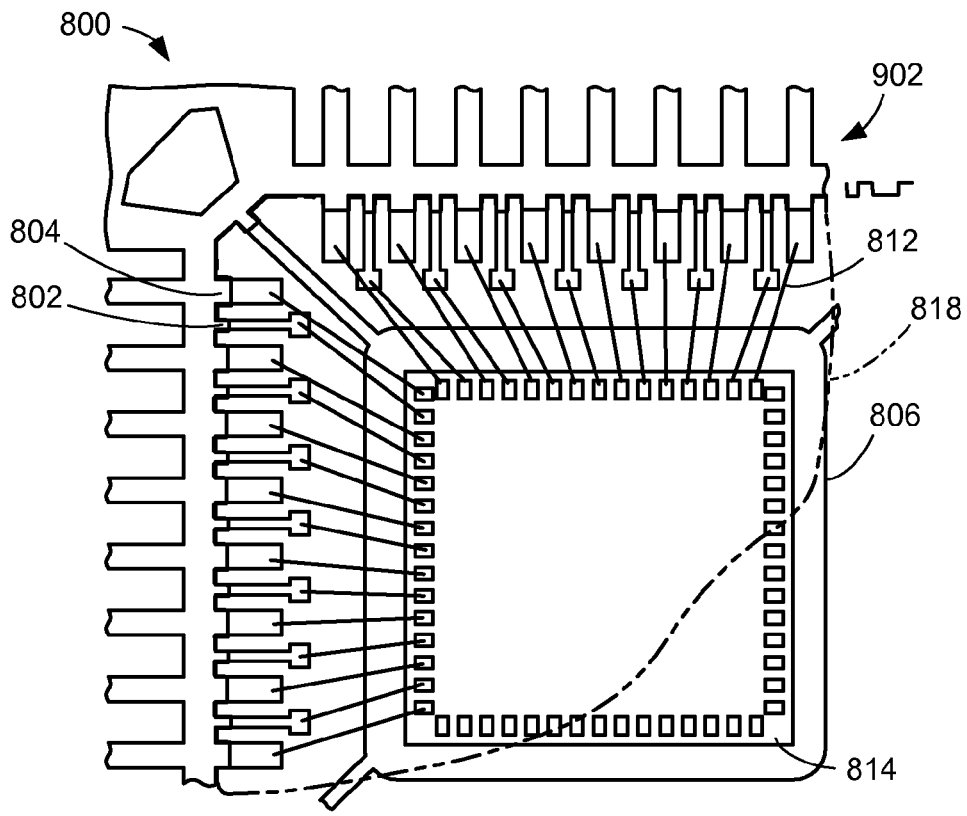
FIG. 11 is the structure of FIG. 10 in a connection phase.

Referring now to FIG. 11, therein is shown the structure of FIG. 10 in a connection phase. The integrated circuit package system 800 preferably includes the encapsulant 818, the leadframe 902, and the stackable integrated circuit 814 over the base integrated circuit 808 of FIG. 8 and the leadframe 902. The die connectors 812 can connect the stackable integrated circuit 814 or the base integrated circuit 808.

The encapsulant 818 is shown with phantom lines for clarity. The stackable integrated circuit 814, the base integrated circuit 808, the die connectors 812, and portions of the leadframe 902 can be covered and protected by the encapsulant 818. The encapsulant 818 can also provide structural integrity to the dummy leads 802, the lead terminals 804, or the die attach pad 806.

Figure 12:
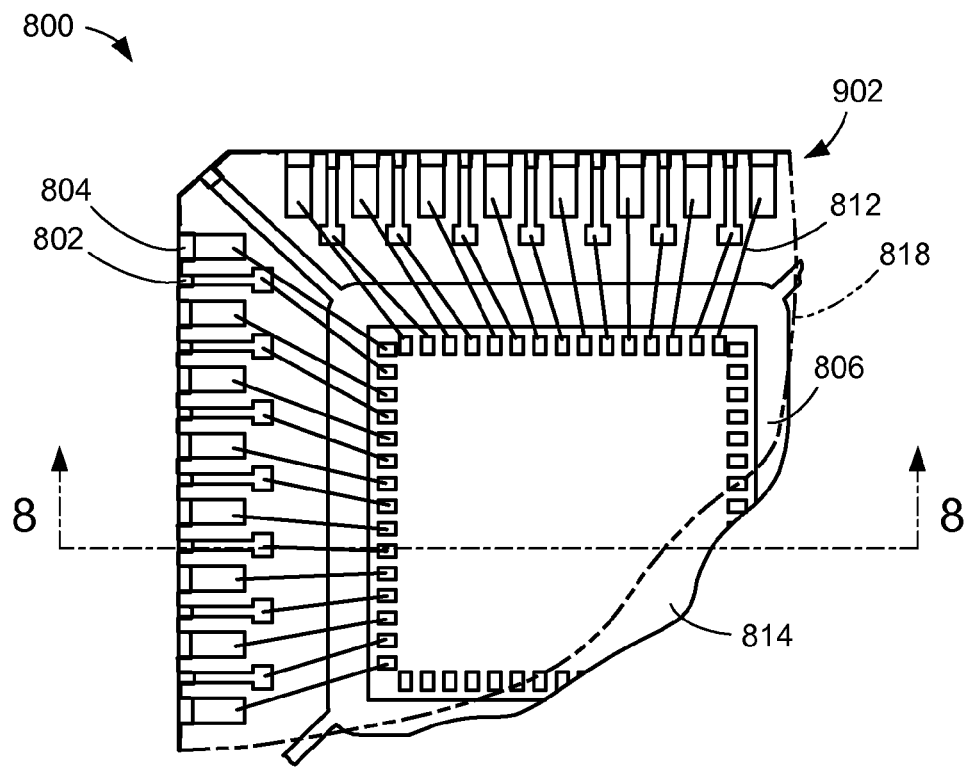
FIG. 12 is the structure of FIG. 11 in an encapsulation phase.

Referring now to FIG. 12, therein is shown the structure of FIG. 11 in an encapsulation phase. The integrated circuit package system 800 preferably includes the encapsulant 818, the dummy leads 802, the lead terminals 804, the die attach pad 806. The dambar 904 of FIG. 9 has been removed.

The dummy leads 802, the lead terminals 804, and the die attach pad 806 are electrically isolated to provide discrete connectivity for electrical signals or levels. Each of the dummy leads 802 or the lead terminals 804 can be connected to electrical signals or levels appropriate to the components or applications.

Figure 13:
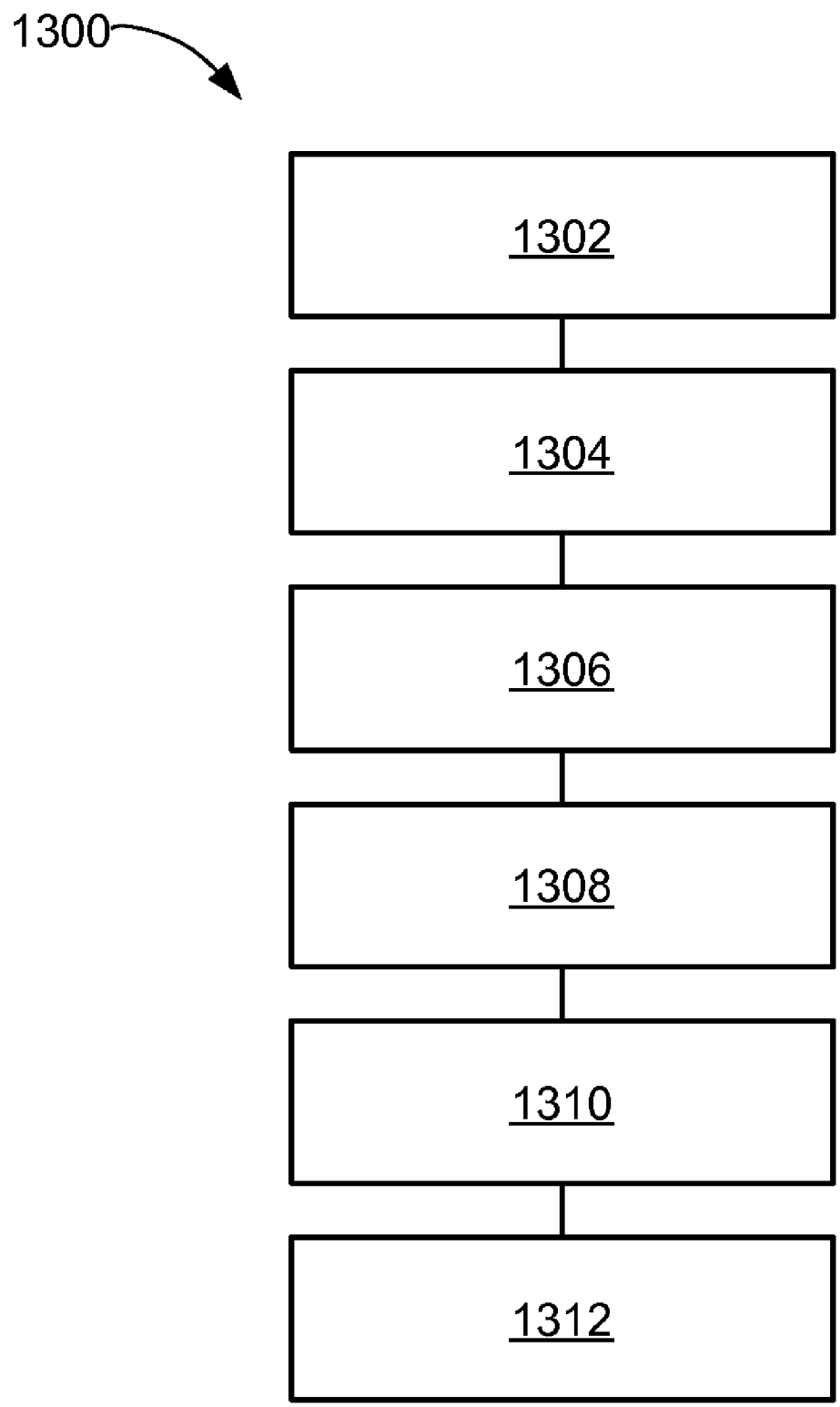
FIG. 13 is a flow chart of an integrated circuit package system for manufacturing the integrated circuit package system in an embodiment of the present invention.

Referring now to FIG. 13, therein is shown a flow chart of an integrated circuit package system 1300 for manufacturing the integrated circuit package system 100 in an embodiment of the present invention. The system 1300 includes providing a lead terminal in a block 1302; forming a dummy lead near the lead terminal in a block 1304; positioning a base integrated circuit adjacent the lead terminal and the dummy lead in a block 1306; connecting a die connector to the base integrated circuit and the dummy lead in a block 1308; mounting a stackable integrated circuit over the base integrated circuit in a block 1310; and connecting another of the die connector to the stackable integrated circuit and the dummy lead.

In greater detail, a system to provide the method and apparatus of the integrated circuit package system 100, in an embodiment of the present invention, is performed as follows:

1. Providing a lead terminal;
2. Forming a dummy lead near the lead terminal;
3. Positioning a base integrated circuit adjacent the lead terminal and the dummy lead;
4. Connecting a die connector to the base integrated circuit and the dummy lead;
5. Mounting a stackable integrated circuit over the base integrated circuit;
6. Connecting another of the die connector to the stackable integrated circuit and the dummy lead; and
7. Applying an encapsulant over the lead terminal, the dummy lead, the die connector, the base integrated circuit and the stackable integrated circuit.

Thus, it has been discovered that the integrated circuit package system method and apparatus of the present invention furnish important and heretofore unknown and unavailable solutions, capabilities, and functional aspects.

The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
   providing a lead terminal;
   forming a dummy lead near the lead terminal;
   positioning a base integrated circuit adjacent the lead terminal and the dummy lead;
   connecting a die connector to the base integrated circuit and the dummy lead;
   mounting a stackable integrated circuit over the base integrated circuit; and
   connecting another of the die connector to the stackable integrated circuit and the dummy lead.

2. The system as claimed in claim 1 wherein attaching the stackable integrated circuit includes:
   applying a spacer material over the base integrated circuit; and
   attaching the stackable integrated circuit over the spacer material.

3. The system as claimed in claim 1 wherein providing the lead terminal includes forming a lead finger.

4. The system as claimed in claim 1 wherein providing the lead terminal includes forming a nolead terminal.

5. The system as claimed in claim 1 wherein forming the dummy lead includes forming the dummy lead having a thickness less than a thickness of the lead terminal.

6. An integrated circuit package system comprising:
   providing a lead terminal;
   forming a dummy lead near the lead terminal;
   positioning a base integrated circuit adjacent the lead terminal and the dummy lead;
   connecting a die connector to the base integrated circuit and the dummy lead;
   mounting a stackable integrated circuit over the base integrated circuit;
   connecting another of the die connector to the stackable integrated circuit and the dummy lead; and
   applying an encapsulant over the lead terminal, the dummy lead, the die connector, the base integrated circuit and the stackable integrated circuit.

7. The system as claimed in claim 6 wherein forming the dummy lead includes forming a jumper node for electrical connection of the stackable integrated circuit and the base integrated circuit without the need for the lead terminal and with the stackable integrated circuit substantially the same size as the base integrated circuit.

8. The system as claimed in claim 6 wherein providing the lead terminal includes forming a lead finger of a quad flat package for electrical connection to the base integrated circuit or the stackable integrated circuit.

9. The system as claimed in claim 6 wherein the lead terminal includes forming a nolead terminal of a quad flat nolead package for electrical connection to the base integrated circuit or the stackable integrated circuit.

10. The system as claimed in claim 6 wherein forming the dummy lead includes half-etching the dummy lead without exposure adjacent a package backside surface.

11. An integrated circuit package system comprising:
a lead terminal;
a dummy lead near the lead terminal;
a base integrated circuit adjacent the lead terminal and the dummy lead;
a die connector to the base integrated circuit and the dummy lead; and
a stackable integrated circuit over the base integrated circuit having another of the die connector attached to the stackable integrated circuit and the dummy lead.

12. The system as claimed in claim 11 further comprising a spacer material over the base integrated circuit with the stackable integrated circuit over the spacer material.

13. The system as claimed in claim 11 wherein the lead terminal is a lead finger.

14. The system as claimed in claim 11 wherein the lead terminal is a nolead terminal.

15. The system as claimed in claim 11 wherein the dummy lead has a thickness less than a thickness of the lead terminal.

16. The system as claimed in claim 11 further comprising:
an encapsulant over the lead terminal, the dummy lead, the die connector, the base integrated circuit and the stackable integrated circuit.

17. The system as claimed in claim 16 the dummy lead is a jumper node for electrical connection of the stackable integrated circuit and the base integrated circuit without the need for the lead terminal and with the stackable integrated circuit substantially the same size as the base integrated circuit.

18. The system as claimed in claim 16 wherein the lead terminal is a lead finger of a quad flat package for electrical connection to the base integrated circuit or the stackable integrated circuit.

19. The system as claimed in claim 16 wherein the lead terminal is a nolead terminal of a quad flat nolead package for electrical connection to the base integrated circuit or the stackable integrated circuit.

20. The system as claimed in claim 16 wherein the dummy lead is half-etched without exposure adjacent a package backside surface.

* * * * *